(12) United States Patent
Minoura et al.

(10) Patent No.: US 12,315,709 B2
(45) Date of Patent: May 27, 2025

(54) METHOD OF PERFORMING MAINTENANCE ON SUBSTRATE PROCESSING APPARATUS

(71) Applicant: Tokyo Electron Limited, Tokyo (JP)

(72) Inventors: Yuya Minoura, Miyagi (JP); Takayuki Suzuki, Miyagi (JP); Takahiro Murakami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/750,473

(22) Filed: Jun. 21, 2024

(65) Prior Publication Data

US 2024/0339307 A1 Oct. 10, 2024

Related U.S. Application Data

(63) Continuation of application No. PCT/JP2022/046384, filed on Dec. 16, 2022.

(30) Foreign Application Priority Data

Dec. 22, 2021 (JP) ................................ 2021-208673

(51) Int. Cl.
*H01J 37/32* (2006.01)
*C23C 16/44* (2006.01)
*H01L 21/67* (2006.01)

(52) U.S. Cl.
CPC ...... *H01J 37/3288* (2013.01); *C23C 16/4404* (2013.01); *C23C 16/4405* (2013.01); *H01J 37/32082* (2013.01); *H01J 37/32449* (2013.01); *H01J 37/32477* (2013.01); *H01J 37/32715* (2013.01); *H01J 37/32862* (2013.01);

(Continued)

(58) Field of Classification Search
CPC ............ H01J 37/3288; H01J 37/32082; H01J 37/32449; H01J 37/32477; H01J 37/32715; H01J 2237/3321; H01J 2237/334; C23C 16/4404; C23C 16/44; H01L 21/67063; H01L 21/67098; H01L 21/67248; H01L 21/3065; H01L 21/31
See application file for complete search history.

(56) References Cited

U.S. PATENT DOCUMENTS

| 2011/0114114 | A1 | 5/2011 | You et al. | |
| 2021/0305057 | A1* | 9/2021 | Ishiharada | ........ H01L 21/67069 |
| 2024/0339307 | A1* | 10/2024 | Minoura | ........... H01J 37/32082 |

FOREIGN PATENT DOCUMENTS

| CN | 106605292 A | 4/2017 |
| CN | 113265626 A | 8/2021 |

(Continued)

*Primary Examiner* — Jeffrie R Lund
(74) *Attorney, Agent, or Firm* — Nath, Goldberg & Meyer; Jerald L. Meyer; Tanya E. Harkins (57) ABSTRACT

A method of performing maintenance on a substrate processing apparatus is provided. The substrate processing apparatus includes a chamber and a gas supplier configured to supply a processing gas to an interior of the chamber. The method includes (a) supplying a first processing gas from the gas supplier to the interior of the chamber, and forming a protective film on a surface of a member in the interior of the chamber, and (b) after (a), exposing the interior of the chamber to an ambient environment and performing the maintenance on the substrate processing apparatus.

22 Claims, 6 Drawing Sheets

(52) U.S. Cl.
CPC .. *H01L 21/67063* (2013.01); *H01L 21/67098* (2013.01); *H01L 21/67248* (2013.01)

(56) References Cited

FOREIGN PATENT DOCUMENTS

| | | |
|---|---|---|
| CN | 113380599 A | 9/2021 |
| JP | H10-242122 A | 9/1998 |
| JP | 2000-340549 A | 12/2000 |
| JP | 2003-007674 A | 1/2003 |
| JP | 2008-140875 A | 6/2008 |
| JP | 2016-072264 A | 5/2016 |
| JP | 2021-136255 A | 9/2021 |
| KR | 1020210108322 A | 9/2021 |
| WO | WO-2023120412 A1 * 6/2023 ......... C23C 16/4404 |

* cited by examiner

METHOD OF PERFORMING MAINTENANCE ON SUBSTRATE PROCESSING APPARATUS

CROSS-REFERENCE TO RELATED APPLICATIONS

This application is a bypass continuation application of international application No. PCT/JP2022/046384 having an international filing date of Dec. 16, 2022 and designating the United States, the international application being based upon and claiming the benefit of priority from Japanese Patent Application No. 2021-208673, filed on Dec. 22, 2021, the entire contents of which are incorporated herein by reference.

TECHNICAL FIELD

The present disclosure relates to a method of performing maintenance on a substrate processing apparatus, and the substrate processing apparatus.

BACKGROUND

Patent Document 1 discloses a configuration in which a vacuum cover for separating a processing space from an exhaust space is provided in an etching apparatus, only a processing chamber is exposed to the atmosphere and an exhaust chamber is kept in a vacuum state during maintenance, and a maintenance method.

PRIOR ART DOCUMENT

Patent Document

Patent Document 1: U.S. Patent Application Publication No. 2011/114114

SUMMARY

One aspect of the present disclosure provides a method of performing maintenance on a substrate processing apparatus. The substrate processing apparatus includes a chamber and a gas supplier configured to supply a processing gas to an interior of the chamber. The method includes (a) supplying a first processing gas from the gas supplier to the interior of the chamber, and forming a protective film on a surface of a member in the interior of the chamber, and (b) after (a), exposing the interior of the chamber to an ambient environment and performing the maintenance on the substrate processing apparatus.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process using a substrate processing apparatus, an interior of a chamber where a semiconductor substrate (hereinafter sometimes referred to as "substrate") is accommodated is kept in a depressurized atmosphere to perform a desired processing on the substrate. An example of the desired processing includes a plasma processing such as etching or film forming.

When performing the desired processing on the substrate under the depressurized atmosphere in the interior of the chamber of the substrate processing apparatus, an internal member of the chamber (hereinafter sometimes referred to as "chamber internal member") undergoes damage due to the processing. Therefore, it is necessary to perform maintenance such as inspection, replacement, and cleaning on the chamber internal member. Since such maintenance is performed with the chamber exposed to the ambient environment, components in the ambient environment remain in the chamber after the maintenance. Most of these components in the ambient environment are removed by evacuating the chamber again to create the depressurized atmosphere. However, in particular, moisture in the ambient environment may adsorb onto a surface of the chamber internal member and remain even under the depressurized atmosphere.

For example, moisture may remain on a surface of an electrostatic chuck, which is the chamber internal member, even under the depressurized atmosphere. According to the findings of the inventors of the present disclosure, when executing a manufacturing process in such a moisture residual state, the substrate may be unstably attracted onto the electrostatic chuck, or the manufacturing process may be unstably performed due to disturbance in the current of the electrostatic chuck.

Therefore, in order to avoid such an unstable attraction or unstable manufacturing process, for example, in the method disclosed in Patent Document 1 above, the vacuum cover is provided to separate the processing space from the exhaust space of the etching apparatus (substrate processing apparatus) so that only the processing chamber is exposed to the ambient environment and the exhaust chamber remains in the vacuum state during maintenance.

However, even in the method disclosed in Patent Document 1, the member in the processing space is still exposed to the ambient environment. As a result, in the related art, heating (baking) is sometimes performed in the interior of the chamber to remove the moisture adsorbed to the surface of the member. Further, such a heating requires a long period of time.

Here, in a case of performing etching as a plasma processing, it is known that as a temperature of the substrate decreases, an etching rate (E/R) is improved. A low-temperature process may be performed on the substrate at a temperature of, for example, 0 degrees C. or less. However, in such a low-temperature process, when moisture remains on the surface of an electrostatic chuck (ESC), the moisture may cool and freeze. This may destabilize the process due to an unstable chucking of the substrate by the electrostatic chuck, disturbance in the current of the electrostatic chuck, a change in the etching rate and the like. To address these matters, it is conceivable to remove the adsorbed moisture by sufficient heating as described above. However, such a heating requires a long period of time, which increases the downtime of the apparatus.

Therefore, the technology according to the present disclosure suppresses the adsorption of moisture to the surface of the chamber internal member, reduces the time required for the heating in the related art, and shortens downtime due to the maintenance on the substrate processing apparatus.

Hereinafter, a configuration of the substrate processing apparatus according to the present embodiment will be described with reference to the drawings. In addition, in this specification, elements having substantially the same functional configuration will be denoted by the same reference numerals, and redundant descriptions thereof will be omitted.

<Plasma Processing System>

Figure 1:
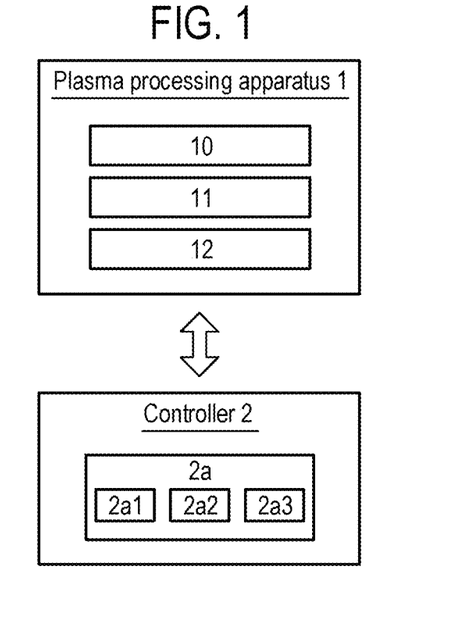
FIG. 1 is a diagram illustrating a configuration example of a plasma processing system.

First, a plasma processing system including a plasma processing apparatus as a substrate processing apparatus according to one embodiment will be described. FIG. 1 is a diagram illustrating a configuration example of the plasma processing system.

In one embodiment, the plasma processing system includes a plasma processing apparatus 1 and a controller 2. The plasma processing system is an example of a substrate processing system, and the plasma processing apparatus 1 is an example of the substrate processing apparatus. The plasma processing apparatus 1 includes a plasma processing chamber 10, a substrate supporter 11, and a plasma generator 12. The plasma processing chamber 10 has a plasma processing space. Further, the plasma processing chamber 10 has at least one gas supply port for supplying at least one processing gas into the plasma processing space, and at least one gas discharge port for discharging the gas from the plasma processing space. The gas supply port is connected to a gas supplier 20 to be described below, and the gas discharge port is connected to an exhaust system 40 to be described below. The substrate supporter 11 is arranged in the plasma processing space and has a substrate support surface for supporting a substrate.

The plasma generator 12 is configured to generate plasma from the at least one processing gas supplied into the plasma processing space. The plasma generated in the plasma processing space may be capacitively coupled plasma (CCP), inductively coupled plasma (ICP), electron-cyclotron-resonance (ECR) plasma, helicon wave excitation plasma (HWP), or surface wave plasma (SWP), or the like. Further, various types of plasma generators, including an alternating current (AC) plasma generator and a direct current (DC) plasma generator, may be used. In one embodiment, an AC signal (AC power) used in the AC plasma generator has a frequency in the range of 100 kHz to 10 GHz. Thus, the AC signal includes a radio frequency (RF) signal and a microwave signal. In one embodiment, the RF signal has a frequency in the range of 100 kHz to 150 MHz.

The controller 2 processes computer-executable instructions that cause the plasma processing apparatus 1 to execute various operations described in the present disclosure. The controller 2 may be configured to control each element of the plasma processing apparatus 1 so as to execute various operations described herein. In one embodiment, a portion or all of the controller 2 may be included in the plasma processing apparatus 1. The controller 2 may include a processor 2a1, a storage 2a2, and a communication interface 2a3. The controller 2 is implemented by, for example, a computer 2a. The processor 2a1 may be configured to perform various control operations by reading programs from the storage 2a2 and executing the read programs. These programs may be stored in advance in the storage 2a2, or may be acquired via a medium if necessary. The acquired programs are stored in the storage 2a2, and are read out and executed from the storage 2a2 by the processor 2a1. The medium may be any of various storage media readable by the computer 2a, or may be a communication line connected to the communication interface 2a3. The processor 2a1 may be a central processing unit (CPU). The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

<Plasma Processing Apparatus>

Figure 2:
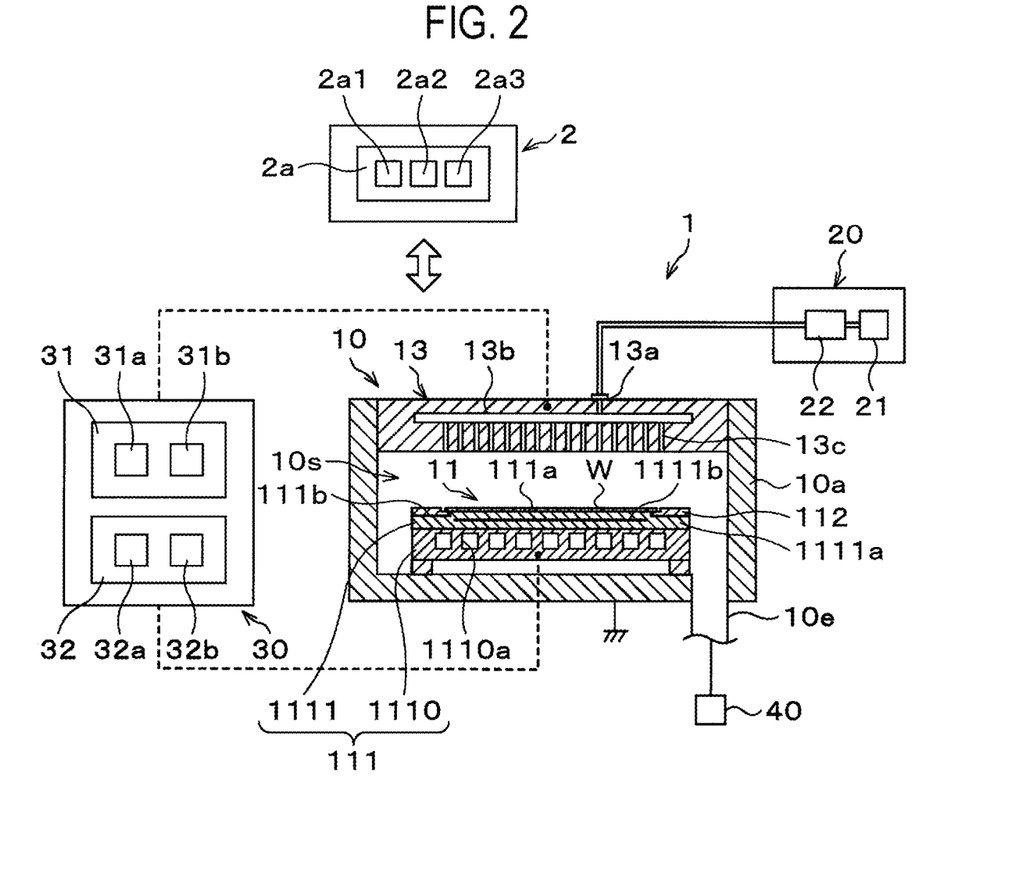
FIG. 2 is a diagram illustrating a configuration example of a capacitively coupled plasma processing apparatus.

Hereinafter, a configuration example of a capacitively coupled plasma processing apparatus as an example of the plasma processing apparatus 1 will be described. FIG. 2 is a diagram illustrating a configuration example of the capacitively coupled plasma processing apparatus.

The capacitively coupled plasma processing apparatus 1 includes the plasma processing chamber 10, the gas supplier 20, a power supply 30, and the exhaust system 40. Further, the plasma processing apparatus 1 includes the substrate supporter 11 and a gas introducer. The gas introducer is configured to introduce at least one processing gas into the plasma processing chamber 10. The gas introducer includes a shower head 13. The substrate supporter 11 is arranged inside the plasma processing chamber 10. The shower head 13 is arranged above the substrate supporter 11. In one embodiment, the shower head 13 constitutes at least a portion of a ceiling of the plasma processing chamber 10. The plasma processing chamber 10 has a plasma processing space 10s defined by the shower head 13, a sidewall 10a of the plasma processing chamber 10, and the substrate supporter 11. The plasma processing chamber 10 is grounded. The shower head 13 and the substrate supporter 11 are electrically insulated from a housing of the plasma processing chamber 10.

The substrate supporter 11 includes a main body 111 and a ring assembly 112. The main body 111 has a central region 111a for supporting a substrate W and an annular region 111b for supporting the ring assembly 112. A wafer is an example of the substrate W. The annular region 111b of the main body 111 surrounds the central region 111a of the main body 111 in a plan view. The substrate W is arranged on the central region 111a of the main body 111, and the ring assembly 112 is arranged on the annular region 111b of the main body 111 so as to surround the substrate W on the central region 111a of the main body 111. Thus, the central region 111a is also referred to as a substrate support surface for supporting the substrate W, and the annular region 111b is also referred to as a ring support surface for supporting the ring assembly 112.

In one embodiment, the main body 111 includes a stand 1110 and an electrostatic chuck 1111. The stand 1110 includes a conductive member. The conductive member of the stand 1110 may function as a lower electrode. The electrostatic chuck 1111 is arranged on the stand 1110. The electrostatic chuck 1111 includes a ceramic member 1111a and an electrostatic electrode 1111b arranged in the ceramic member 1111a. The ceramic member 1111a has the central region 111a. In one embodiment, the ceramic member 1111a also has the annular region 111b. In addition, another member surrounding the electrostatic chuck 1111, such as an annular electrostatic chuck or an annular insulating member, may have the annular region 111b. In this case, the ring assembly 112 may be arranged on the annular electrostatic chuck or the annular insulating member, or may be arranged on both the electrostatic chuck 1111 and the annular insulating member. Further, at least one RF/DC electrode, which is coupled to a radio-frequency (RF) power supply 31 and/or a DC power supply 32 to be described below, may be arranged in the ceramic member 1111a. In this case, the at least one RF/DC electrode functions as a lower electrode. When a bias RF signal and/or DC signal to be described below is supplied to the at least one RF/DC electrode, the RF/DC electrode is also called a bias electrode. In addition, the conductive member of the stand 1110 and the at least one RF/DC electrode may function as a plurality of lower electrodes. Further, the electrostatic electrode 1111b may function as a lower electrode. Thus, the substrate supporter 11 includes at least one lower electrode.

The ring assembly 112 includes one or a plurality of annular members. In one embodiment, one or a plurality of annular members include one or a plurality of edge rings and at least one covering. The edge ring is made of a conductive material or insulating material, and the covering is made of an insulating material.

Further, the substrate supporter 11 may include a temperature regulation module configured to regulate at least one of the electrostatic chuck 1111, the ring assembly 112, and the substrate W to a target temperature. The temperature regulation module may include a heater, a heat-transfer medium, a flow path 1110a, or a combination thereof. A heat transfer fluid such as brine or gas flows through the flow path 1110a. In one embodiment, the flow path 1110a is formed in the stand 1110, and one or a plurality of heaters are arranged in the ceramic member 1111a of the electrostatic chuck 1111. Further, the substrate supporter 11 may include a heat-transfer gas supplier configured to supply a heat-transfer gas to a gap between a back surface of the substrate W and the central region 111a.

The shower head 13 is configured to introduce at least one processing gas from the gas supplier 20 into the plasma processing space 10s. The shower head 13 has at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. In addition to the shower head 13, the gas introducer may further include one or a plurality of side gas injectors (SGI) provided in one or a plurality of openings formed in the sidewall 10a.

The gas supplier 20 may include at least one gas source 21 and at least one flow rate controller 22. In one embodiment, the gas supplier 20 is configured to supply at least one processing gas from respective gas source 21 to the shower head 13 via respective flow rate controller 22. Each flow rate controller 22 may include, for example, a mass flow controller or a pressure-controlled flow rate controller. Further, the gas supplier 20 may include at least one flow-rate modulation device that modulates or pulses a flow rate of at least one processing gas.

The power supply 30 includes the RF power supply 31 coupled to the plasma processing chamber 10 via at least one impedance matching circuit. The RF power supply 31 is configured to supply at least one RF signal (RF power) to at least one lower electrode and/or at least one upper electrode. As a result, plasma is generated from the at least one processing gas supplied to the plasma processing space 10s. Thus, the RF power supply 31 may function as at least a portion of the plasma generator 12. Further, by supplying a bias RF signal to at least one lower electrode, a bias potential occurs in the substrate W so that ion components in the generated plasma are drawn into the substrate W.

In one embodiment, the RF power supply 31 includes a first RF generator 31a and a second RF generator 31b. The first RF generator 31a is coupled to at least one lower electrode and/or at least one upper electrode via at least one impedance matching circuit and is configured to generate a source RF signal (source RF power) for plasma generation. In one embodiment, the source RF signal has a frequency in the range of 10 MHz to 150 MHz. In one embodiment, the first RF generator 31a may be configured to generate a plurality of source RF signals with different frequencies. The generated one or plurality of source RF signals are supplied to at least one lower electrode and/or at least one upper electrode.

The second RF generator 31b is coupled to at least one lower electrode via at least one impedance matching circuit and is configured to generate a bias RF signal (bias RF power). A frequency of the bias RF signal may be the same as or different from the frequency of the source RF signal. In one embodiment, the bias RF signal has a lower frequency than that of the source RF signal. In one embodiment, the bias RF signal has a frequency in the range of 100 kHz to 60 MHz. In one embodiment, the second RF generator 31b may be configured to generate a plurality of bias RF signals with different frequencies. The generated one or plurality of bias RF signals are supplied to at least one lower electrode. Further, in various embodiments, at least one of the source RF signal and the bias RF signal may be pulsed.

Further, the power supply 30 may include the DC power supply 32 coupled to the plasma processing chamber 10. The DC power supply 32 includes a first DC generator 32a and a second DC generator 32b. In one embodiment, the first DC generator 32a is connected to at least one lower electrode and is configured to generate a first DC signal. The generated first DC signal is applied to at least one lower electrode. In one embodiment, the second DC generator 32b is connected to at least one upper electrode and is configured to generate a second DC signal. The generated second DC signal is applied to at least one upper electrode.

In various embodiments, the first and second DC signals may be pulsed. In this case, a voltage pulse sequence is applied to at least one lower electrode and/or at least one upper electrode. Voltage pulses may have a rectangular, trapezoidal, or triangular pulse waveform, or a combination thereof. In one embodiment, a waveform generator for generating the voltage pulse sequence from DC signals is connected between the first DC generator 32*a* and at least one lower electrode. Thus, the first DC generator 32*a* and the waveform generator constitute a voltage pulse generator. When the second DC generator 32*b* and the waveform generator constitute the voltage pulse generator, the voltage pulse generator is connected to at least one upper electrode. The voltage pulses may have a positive polarity or a negative polarity. Further, the voltage pulse sequence may include one or a plurality of positive-polarity voltage pulses and one or a plurality of negative-polarity voltage pulses within one cycle. In addition, the first and second DC generators 32*a* and 32*b* may be provided in addition to the RF power supply 31, and the first DC generator 32*a* may be provided in place of the second RF generator 31*b*.

The exhaust system 40 may be connected to a gas outlet 10*e* provided, for example, at the bottom of the plasma processing chamber 10. The exhaust system 40 may include a pressure adjustment valve and a vacuum pump. An internal pressure of the plasma processing space 10*s* is adjusted by the pressure adjustment valve. The vacuum pump may include a turbo-molecular pump, a dry pump, or a combination thereof.

<First Embodiment of Maintenance Method>

Figure 3:
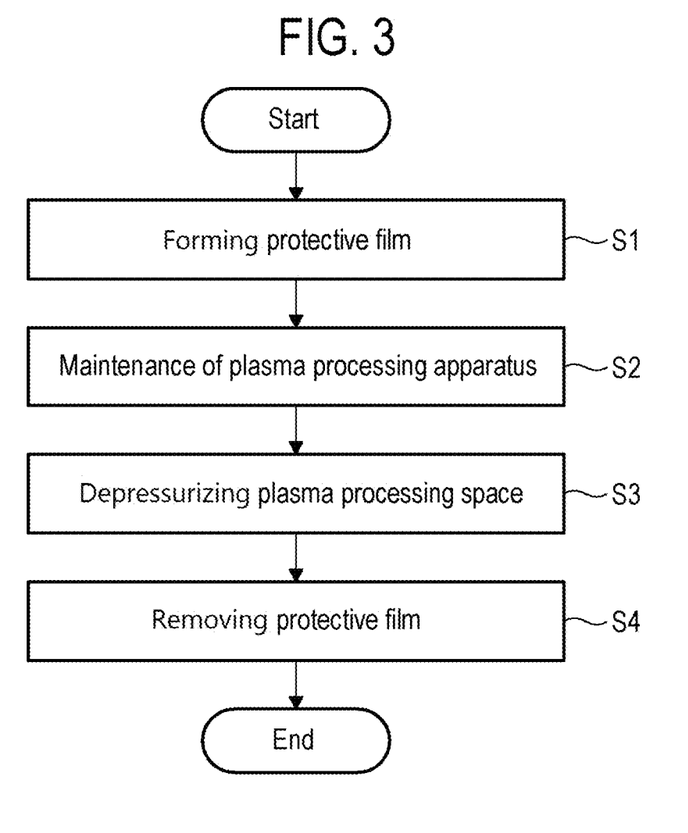
FIG. 3 is a flowchart illustrating major operations of a maintenance method according to a first embodiment.
Figure 4A:
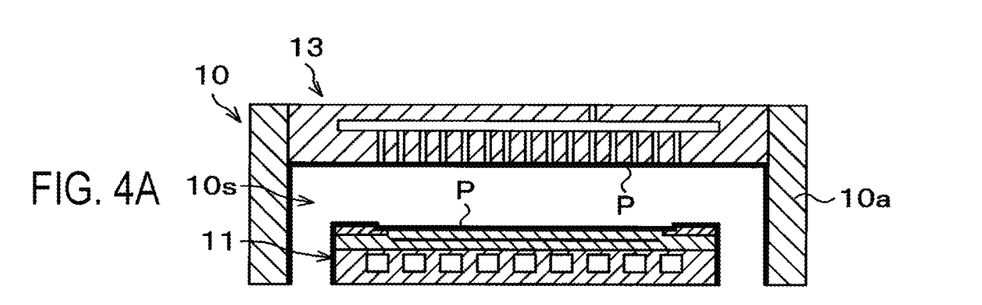
FIGS. 4A to 4C are explanatory diagrams illustrating states of an interior of a plasma processing chamber when the maintenance method according to the first embodiment is performed.
Figure 4B:
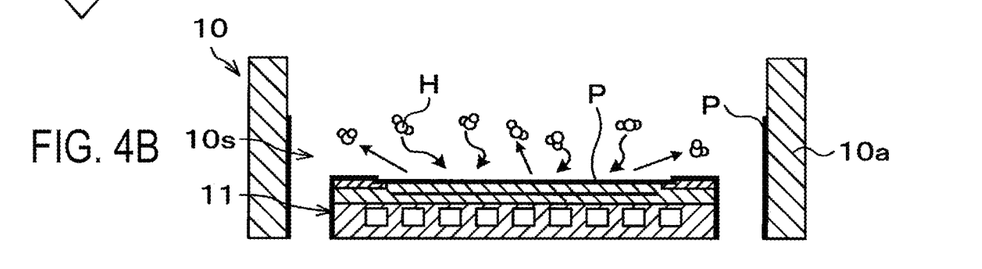
Figure 4C:
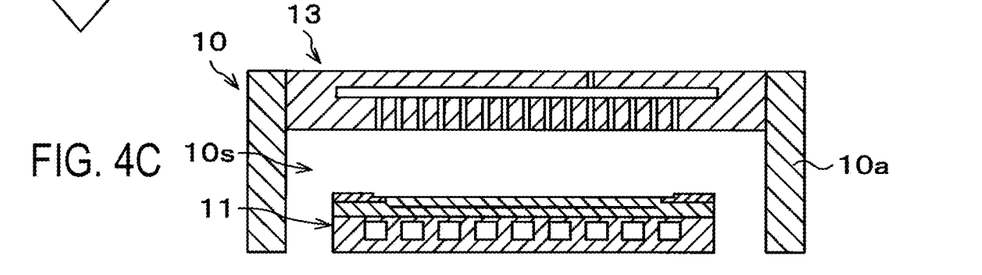

Next, a maintenance method MT1 of the plasma processing apparatus 1 according to the first embodiment will be described. FIG. 3 is a flowchart illustrating major operations of the maintenance method MT1. FIGS. 4A to 4C are explanatory diagrams illustrating states of the interior of the plasma processing chamber 10 when the maintenance method MT1 is performed.

The maintenance method MT1 may be executed, for example, between the end time of the plasma processing using the plasma processing apparatus 1 and the start time of a next plasma processing. However, these times are merely examples of times when the maintenance method MT1 may be executed, but not limited thereto. For example, the maintenance method MT1 may be executed when resuming the plasma processing in a state where the plasma processing apparatus 1 is not used for a long period of time (in a long-period idling state).

[Step S1]

First, as illustrated in FIG. 4A, a protective film P is formed on a surface of an internal member of the plasma processing chamber 10 (hereinafter sometimes referred to as "chamber internal member") using plasma of a first processing gas (step S1 in FIG. 3). The protective film P may be formed to continuously cover the surface of the chamber internal member without any gap. The chamber internal member includes at least a member exposed to the plasma processing space 10*s*. For example, in addition to the substrate supporter 11, the chamber internal member includes the sidewall 10*a* of the plasma processing chamber 10 and the shower head 13. In other words, the protective film P is formed, for example, on a surface of the substrate supporter 11, an inner surface of the sidewall 10*a*, and a lower surface of the shower head 13.

The protective film P has water repellency. That is, a surface of the protective film P exposed to the plasma processing space 10*s* has water repellency. Further, there is no outgassing of harmful gases from the protective film P. An example of such a film may include a fluorine-containing film. In this case, the first processing gas includes a fluorine-containing gas. The fluorine-containing gas is, for example, a fluorocarbon gas such as $CF_4$, $C_4F_6$, or $C_4F_8$. In this case, a fluorocarbon film may be formed as the protective film P. Since the fluorocarbon film has fluorine terminations on the outermost layer, the protective film P formed of the fluorocarbon film has water repellency. In addition, the first processing gas may also contain a noble gas. The noble gas is, for example, Ar, He, or the like.

In step S1, first, the interior of the plasma processing chamber 10 is sealed to form the plasma processing space 10*s*. Thereafter, the first processing gas is supplied from the gas supplier 20 to the plasma processing space 10*s* via the shower head 13. Further, the plasma processing space 10*s* is depressurized to a desired level of vacuum by the exhaust system 40.

Subsequently, source RF power for plasma generation is supplied to a conductive member of the substrate supporter 11 and/or a conductive member of the shower head 13 by the first RF generator 31*a* of the RF power supply 31. This excites the first processing gas to generate plasma. At this time, no bias RF signal for ion drawing is supplied from the second RF generator 31*b*. Then, the protective film P is formed on the surface of the chamber internal member by the action of the generated plasma.

In addition, a surface temperature of the chamber internal member in this step S1, i.e., the film formation temperature of the protective film P is, for example, the same as a temperature during maintenance in the next step S2, and is, for example, room temperature. Thus, there is no need to change temperature settings during transition from step S1 to step S2. However, the surface temperature of the chamber internal member is not limited thereto. The surface temperature of the chamber internal member may be lower or higher than room temperature based on a film quality or film formation rate of the protective film P being formed.

[Step S2]

Subsequently, as illustrated in FIG. 4B, the interior of the plasma processing chamber 10 is exposed to the ambient environment, and maintenance on the plasma processing apparatus 1 is performed (step S2 in FIG. 3).

In step S2, first, the shower head 13 is removed and the interior of the plasma processing chamber 10 is exposed to the ambient environment. Subsequently, maintenance such as inspection, replacement, or cleaning of the chamber internal member is performed. In other words, the maintenance is performed under the ambient environment containing moisture H.

In this regard, since the protective film P is formed on the surface of the chamber internal member in step S1, the moisture H may come into contact the protective film P in step S2, but does not come into contact with the surface of the chamber internal member. Further, since the protective film P has water repellency, the moisture H that comes into contact with the protective film does not remain on the surface of the protective film P.

In addition, a maintenance temperature in step S2, i.e., the temperature of the chamber internal member may be room temperature. Alternatively, the maintenance temperature may be set higher than a dew point temperature of the ambient environment. By setting the maintenance temperature to be higher than the dew point temperature of the ambient environment, the moisture H contained in the ambient environment may be suppressed from condensing or freezing. Further, the temperature of the chamber internal member may be not more than 50 degrees C. By setting the temperature not more than 50 degrees C., the risk of burns or injuries to workers who perform the maintenance is minimized. When the temperature of the chamber internal member is not more than the dew point temperature of the ambient environment or higher than 50 degrees C. during the formation of the protective film in step S1, it is adjusted to a range higher than the dew point temperature of the ambient environment and not more than 50 degrees C. before transitioning from step S1 to step S2.

[Step S3]

Subsequently, the plasma processing space 10s is depressurized by evacuation (step S3 in FIG. 3). In step S3, the interior of the plasma processing chamber 10 is sealed to form the plasma processing space 10s. Thereafter, the plasma processing space 10s is depressurized to a desired level of vacuum by the exhaust system 40. As a result, a gas containing at least a portion of the moisture H in the ambient environment is removed.

[Step S4]

Subsequently, as illustrated in FIG. 4C, the protective film P is removed from the surface of the chamber internal member using plasma from a second processing gas (step S4 in FIG. 3). The second processing gas may be any gas capable of removing the protective film P. When the protective film P is a fluorocarbon film, an oxidizing gas or a reducing gas may be used as the second processing gas. The oxidizing gas is, for example, $O_2$, CO or $CO_2$ and the reducing gas is, for example, $H_2$ or $NH_3$. In addition, the second processing gas may further contain a noble gas. The noble gas is, for example, Ar or He, or the like.

In step S4, the second processing gas is supplied from the gas supplier 20 to the plasma processing space 10s via the shower head 13. Further, in a state where the plasma processing space 10s has been depressurized to the desired level of vacuum, source RF power for plasma generation is supplied to the conductive member of the substrate supporter 11 and/or the conductive member of the shower head 13 by the first RF generator 31a of the RF power supply 31. This excites the second processing gas to generate plasma. At this time, a bias RF signal for ion drawing may be supplied from the second RF generator 31b. Then, the protective film P is removed from the surface of the chamber internal member by the action of the generated plasma.

In the maintenance method MT1, steps S1 to S4 above are performed, and the plasma processing is subsequently performed. Next, effects of the maintenance method MT1 will be described, compared to a maintenance method in the related art as Comparative example.

In the maintenance method in the related art as Comparative example, steps S1 and S4 of the maintenance method MT1 according to the first embodiment are omitted. That is, the interior of the plasma processing chamber 10 is exposed to the ambient environment and the maintenance on the plasma processing apparatus 1 is performed, without forming the protective film P on the surface of the chamber internal member.

In this case, during the maintenance, the moisture H in the ambient environment adsorbs to, for example, the central region 111a of the electrostatic chuck 1111. This leads to the formation of an adsorptive layer through a reaction with the moisture H in the central region 111a. In particular, when the plasma processing performed before and after the maintenance is a low-temperature process in which the surface temperature of the electrostatic chuck 1111 (substrate W) is, for example, at or below 0 degrees C., the moisture H in the adsorptive layer may cool and freeze during the plasma processing. In other words, this adsorptive layer remains even when the plasma processing space 10s is depressurized to the desired level of vacuum during the plasma processing after the maintenance. Then, when the plasma processing is performed in such a state with the residual moisture H, it may lead to an unstable attraction of the substrate W by the electrostatic chuck 1111, or an unstable process due to disturbance in the current of the electrostatic chuck 1111.

Therefore, in the related art, there was a case where the interior of the plasma processing chamber 10 was heated (baked) to remove the moisture H. However, such a heating requires a long period of time. In particular, when the plasma processing is the low-temperature process as described above, the moisture H may freeze, which requires more prolonged heating time and increases downtime of the apparatus.

On the other hand, according to the maintenance method MT1 of the first embodiment, in step S1, the protective film P is formed on the surface of the chamber internal member before opening the interior of the plasma processing chamber 10 to the ambient environment in step S2. Although the chamber internal member is exposed to the ambient environment in the subsequent step S2, the protective film P is formed on the surface of the chamber internal member in step S1, so that the moisture H may come into contact with the protective film P, but does not come into contact with the surface of the chamber internal member. Further, since the protective film P has water repellency, the moisture H that comes into contact with the protective film P does not remain on the surface of the protective film P. Thereafter, in step S3, the plasma processing space 10s is depressurized to the desired level of vacuum to remove a gas containing at least a portion of the moisture H. In step S4, the protective film P is removed from the plasma processing space 10s kept at the desired level of vacuum. Therefore, there is no contact between the gas containing the moisture H and the surface of the chamber internal member after removing the protective film P. This eliminates a need to heat the chamber internal member for a long period of time as in the method in the related art after removing the protective film P, which shortens the downtime of the apparatus. In particular, the above effects may be obtained even when the plasma processing performed before and after the maintenance is the low-temperature process. As a result, throughput of the substrate processing may be improved.

In addition, the water-repellent protective film P formed in step S1 is not limited to the fluorine-containing film. For example, a silicon-containing film may be formed using an aminosilane-based gas such as a hexamethyl disilazane (HMDS) or trimethy silyl dimethyl amine (TMSDMA) gas. The silicon-containing film formed using the HMDS gas has amino group terminations on the outermost layer, and therefore, the protective film P as the silicon-containing film formed using the HMDS gas has water repellency. In this case, a fluorine-containing gas may be used as the second processing gas for removing the protective film P. The fluorine-containing gas is, for example, a fluorocarbon gas such as $CF_4$, $C_4F_6$, or $C_4F_8$. Further, the protective film P is not limited to the fluorine-containing film and the silicon-containing film as long as it has water repellency.

Further, in step S1, the protective film P may be composed of a plurality of layers. In this case, for example, a plurality of types of processing gases are sequentially introduced into the plasma processing space 10s, and protective layers are sequentially stacked on the surface of the chamber internal member using plasma generated from the plurality of types of processing gases, thereby forming the protective film P in the form of a plurality of layers. Further, in this case, when the protective film P has water repellency, a plurality of protective layers may be stacked in such a way that an uppermost layer, i.e., a surface exposed to the plasma processing space becomes a water-repellent protective layer. In this case, the first processing gas capable of forming the uppermost protective layer may be a fluorine-containing gas as described above, or may be an aminosilane-based gas such as hexamethyl disilazane (HMDS) or trimethy silyl dimethyl amine (TMSDMA).

In addition, when the chamber internal member includes a member made of Si or quartz, there is a risk of damage to the chamber internal member due to a fluorine component.

Therefore, when the protective film P is formed with a plurality of layers, a lowermost layer (base layer) may be a film that does not contain halogens such as fluorine. In this case, damage to the surface of that chamber internal member may be suppressed at an interface between the protective film P and the chamber internal member.

In addition, the base layer may not have water repellency. As described above, the base layer may be any film as long as it does not contain halogens such as fluorine. For example, the base layer may be a carbon film or a silicon-containing film such as a silicon oxide film. A gas that forms a carbon film as the base layer may be, for example, a hydrocarbon ($C_xH_y$: x and y are integers) gas. Examples of the hydrocarbon gas include $CH_4$, $C_2H_6$, $C_2H_4$, $C_3H_8$, and $C_3H_6$. Further, a gas that forms a silicon oxide film as the base layer is, for example, a combination of an oxygen gas and a silicon-containing gas such as a $SiCl_4$ gas or an aminosilane-based gas.

In addition, when forming the protective film P with a plurality of layers, the removal of the protective film P in step S4 is performed using a gas adapted for each layer. For example, when the protective film P is formed in step S1 by forming the base layer using a hydrocarbon gas and then forming the uppermost layer using the HMDS gas, a Si-containing film as the uppermost layer is removed using a fluorine-containing gas, and then, a carbon film as the base layer is removed using a gas capable of removing the carbon film. An oxidizing gas or a reducing gas may be used as the gas capable of removing the carbon film. The oxidizing gas is, for example, $O_2$, CO or $CO_2$ and the reducing gas is, for example, $H_2$ or $NH_3$. In addition, these gases may further contain a noble gas. The noble gas is, for example, Ar or He, or the like. However, both the layers may be removed at the same time as long as there is a gas capable of removing the base layer and the uppermost layer in a simultaneous manner. For example, when the base layer is formed using a hydrocarbon gas and then the uppermost layer is formed using a fluorocarbon gas, an oxidizing gas (e.g. $O_2$) or a reducing gas (e.g. $H_2$) may be used to remove both the layers in a simultaneous manner.

Further, the protective film P is formed by the plasma from the first processing gas in step S1, but the method of forming the protective film P is not limited thereto. Further, the protective film P is removed by the plasma from the second processing gas in step S4, but the method of removing the protective film P is not limited thereto. In other words, the formation and removal of the protective film P do not necessarily require the plasma.

<Second Embodiment of Maintenance Method>

Figure 5:
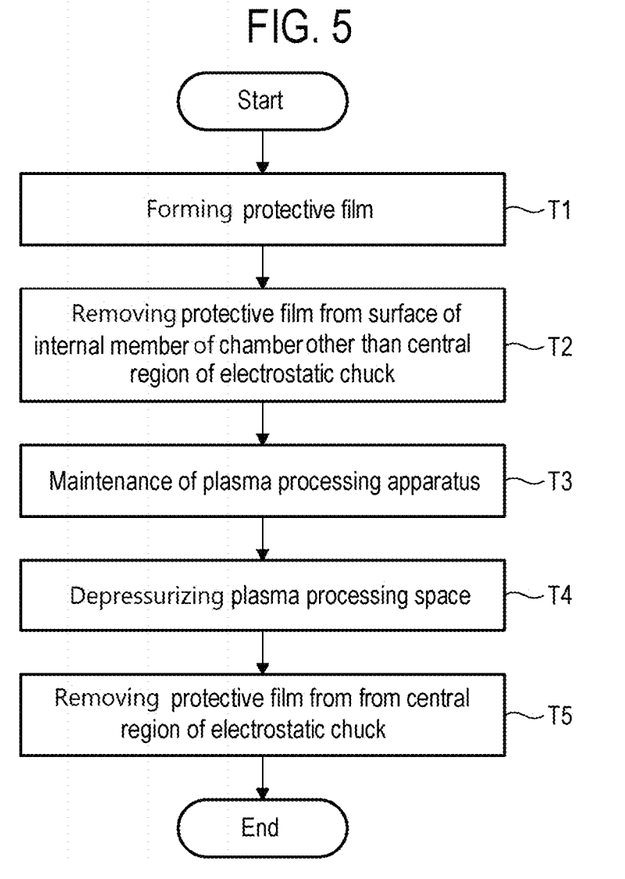
FIG. 5 is a flowchart illustrating major operations of a maintenance method according to a second embodiment.

Next, a maintenance method MT2 of the plasma processing apparatus 1 according to a second embodiment will be described. FIG. 5 is a flowchart illustrating major operations of the maintenance method MT2. FIGS. 6A to 6E are explanatory diagrams illustrating states of the interior of the plasma processing chamber 10 when the maintenance method MT2 is performed.

The maintenance method MT2 may be executed, for example, between the end time of the plasma processing using the plasma processing apparatus 1 and the start time of a next plasma processing, similar to the maintenance method MT1. However, these times are merely exemplary times when the maintenance method MT2 may be executed, but not limited to thereto.

[Step T1]

Figure 6A:
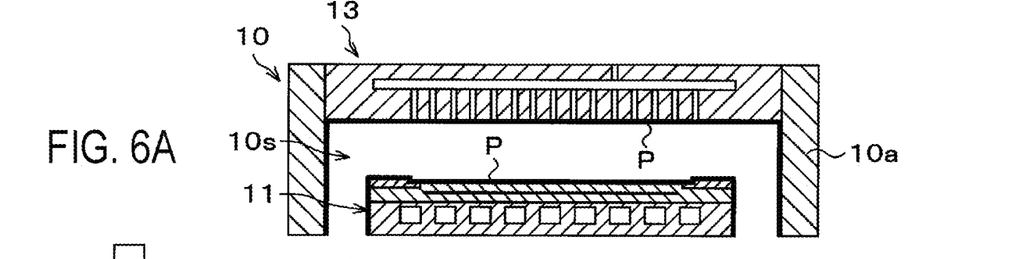
FIGS. 6A to 6E are explanatory diagrams illustrating states of an interior of a plasma processing chamber when the maintenance method according to the second embodiment is performed.

First, as illustrated in FIG. 6A, the protective film P is formed on the surface of the chamber internal member using the plasma from the first processing gas (step T1 in FIG. 5). This step T1 is the same as step S1 of the maintenance method MT1, and thus, a description thereof is omitted.

[Step T2]

Subsequently, the protective film P on the surface of the chamber internal member other than the central region 111a of the electrostatic chuck 1111 is removed using the plasma from the second processing gas (step T2 in FIG. 3).

Figure 6B:
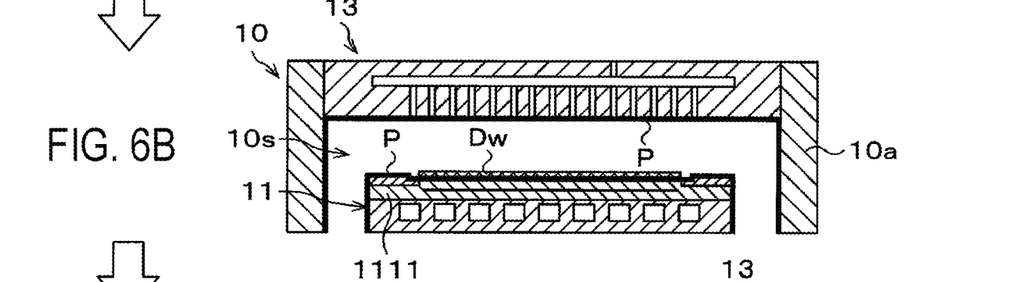

In step T2, first, as illustrated in FIG. 6B, a substrate Dw (hereinafter referred to as "dummy substrate Dw"), which is different from the substrate W as a processing target object, is loaded to the interior of the plasma processing chamber 10, and the dummy substrate Dw is placed on the electrostatic chuck 1111. Further, after the loading of the dummy substrate Dw, the plasma processing space 10s is depressurized to a desired degree of vacuum by the exhaust system 40.

Subsequently, the second processing gas is supplied from the gas supplier 20 to the plasma processing space 10s via the shower head 13. Further, in a state where the plasma processing space 10s has been depressurized to the desired level of vacuum, source RF power for plasma generation is supplied to the conductive member of the substrate supporter 11 and/or the conductive member of the shower head 13 by the first RF generator 31a of the RF power supply 31. This excites the second processing gas to generate plasma. At this time, a bias RF signal for ion drawing may be supplied from the second RF generator 31b. Then, the protective film P on the surface of the chamber internal member other than the central region 111a of the electrostatic chuck 1111 is removed by the action of the generated plasma.

Figure 6C:
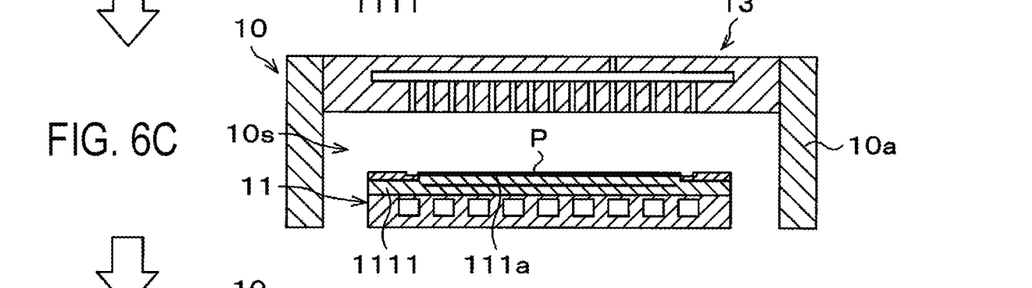

Thereafter, as illustrated in FIG. 6C, the dummy substrate Dw is unloaded from the plasma processing chamber 10. In this way, the protective film P is formed only in the central region 111a of the electrostatic chuck 1111.

[Step T3]

Figures 6D, 6E:
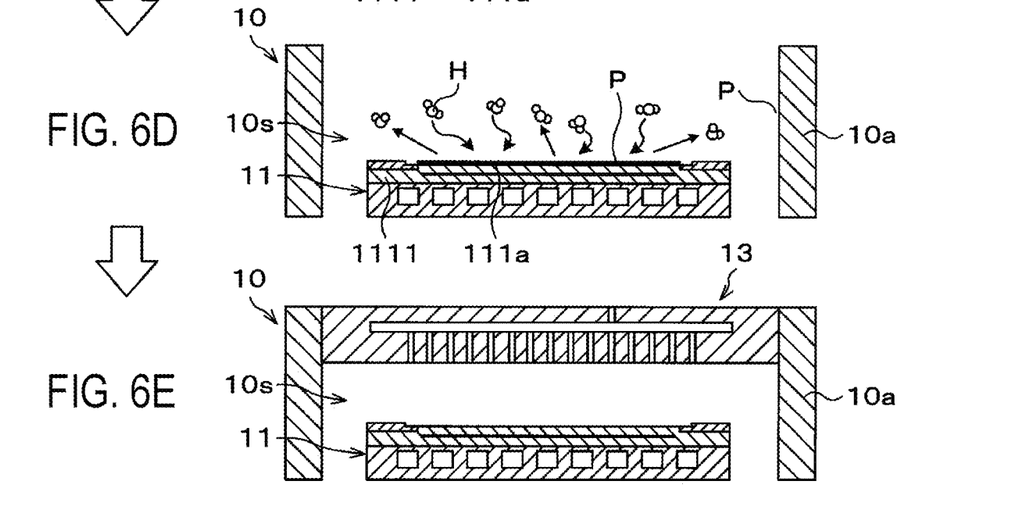

Subsequently, as illustrated in FIG. 6D, the interior of the plasma processing chamber 10 is exposed to the ambient environment, and maintenance on the plasma processing apparatus 1 is performed (step T3 in FIG. 3). This step T3 is the same as step S2 of the maintenance method MT1, and thus, a description thereof is omitted. Then, in step T3, no moisture H remains on the surface of the protective film P in the central region 111a of the electrostatic chuck 1111.

[Step T4]

Subsequently, the plasma processing space 10s is depressurized by evacuation (step T4 in FIG. 3). This step T3 is the same as step S3 of the maintenance method MT1, and thus, a description thereof is omitted. Then, in step T4, a gas containing at least a portion of the moisture H in the ambient environment is removed.

[Step T5]

Subsequently, as illustrated in FIG. 6E, the protective film P is removed from the central region 111a of the electrostatic chuck 1111 using the plasma of the second processing gas (step T5 in FIG. 3). This step T5 is the same as step S4 of the maintenance method MT1, and thus, a description thereof is omitted. Then, in Step T5, the protective film P is removed from the entire surface of the chamber internal member.

In the maintenance method MT2 of the second embodiment as well, the same effects as in the maintenance method MT1 of the first embodiment may be achieved. In other words, it is possible to shorten downtime of the apparatus and to improve throughput of the substrate processing.

Further, in step T2 of the maintenance method MT2, the protective film P is removed from the surface of the chamber internal member other than the central region 111a of the electrostatic chuck 1111, and the protective film P is formed only on the central region 111a. As described above, in the maintenance method in the related art, matters such as unstable attraction of the substrate W and unstable process may occur due to the moisture H adsorbed to the central region 111a of the electrostatic chuck 1111. In this regard, the maintenance method MT2 may reliably eliminate the moisture H in the central region 111a, thus solving matters such as unstable attraction of the substrate W and unstable process.

Other Embodiments

The maintenance methods MT1 and MT2 described above are not limited to specific processes according to the above embodiments. For example, by applying the maintenance methods MT1 and MT2 to all processes that require a sufficiently low level of moisture in the atmosphere inside the plasma processing chamber 10, it is possible to reduce or eliminate the time required for the heating (baking) in the related art. Thus, the maintenance methods MT1 and MT2 may be applied to other apparatuses without being limited to the plasma processing apparatus 1, and may also be applied, for example, to apparatuses that use no plasma. For the specific processes, in particular, for a low-temperature process in which the electrostatic chuck 1111 is, for example, at or below 0 degrees C., these methods exhibit more advantageous effects since they may suppress the adsorption of moisture onto the surface of the electrostatic chuck 1111 that is prone to moisture adsorption due to condensation.

According to the present disclosure, it is possible to shorten a downtime due to maintenance on a substrate processing apparatus.

The embodiments disclosed herein should be considered to be exemplary and not limitative in all respects. The above embodiments may be omitted, replaced or modified in various embodiments without departing from the scope of the appended claims and their gist.

What is claimed is:

1. A method of performing maintenance on a substrate processing apparatus, the substrate processing apparatus comprising:
a chamber; and
a gas supplier configured to supply a processing gas to an interior of the chamber,
the maintenance method comprising:
(a) supplying a first processing gas from the gas supplier to the interior of the chamber, and forming a protective film on a surface of a member in the interior of the chamber; and
(b) after (a), exposing the interior of the chamber to an ambient environment and performing the maintenance on the substrate processing apparatus.

2. The method of claim 1, wherein, in (a), a plasma is generated from the first processing gas to form the protective film.

3. The method of claim 2, further comprising: (c) after (b), removing the protective film.

4. The method of claim 3, wherein, in (c), a second processing gas is supplied to the interior of the chamber so that a plasma is generated from the second processing gas to remove the protective film.

5. The method of claim 4, wherein the first processing gas is a fluorocarbon gas, and the second processing gas is an oxidizing gas or a reducing gas.

6. The method of claim 5, wherein the oxidizing gas is $O_2$, CO or $CO_2$ and the reducing gas is $H_2$ or $NH_3$.

7. The method of claim 4, wherein the protective film includes a first layer and a second layer, and
wherein (a) includes forming the first layer using a hydrocarbon gas, and forming the second layer using a fluorocarbon gas after the forming the first layer.

8. The method of claim 7, wherein the second processing gas is an oxidizing gas or a reducing gas, and
wherein, in (c), the first layer and the second layer are removed.

9. The method of claim 8, wherein the protective film has water repellency.

10. The method of claim 9, wherein the first processing gas includes a fluorine-containing gas.

11. The method of claim 10, wherein, in (a), the protective film is composed of a plurality of layers.

12. The method of claim 11, wherein the substrate processing apparatus further comprises a substrate supporter provided in the interior of the chamber, and
wherein, in the forming the protective film, the protective film is formed on a substrate support surface of the substrate supporter.

13. The method of claim 12, wherein, after (a) and before (b), the protective film is removed from a surface of the member excluding the substrate support surface while the substrate is supported on the substrate supporter.

14. The method of claim 4, wherein the first processing gas is an aminosilane gas, and the second processing gas is a fluorine-containing gas.

15. The method of claim 14, wherein the fluorine-containing gas is a fluorocarbon gas, and an aminosilane gas is a hexamethyl disilazane (HMDS) or trimethy silyl dimethyl amine (TMSDMA) gas.

16. The method of claim 4, wherein the protective film includes a first layer and a second layer, and
wherein (a) includes forming the first layer using a hydrocarbon gas, and forming the second layer using an aminosilane gas after the forming the first layer.

17. The method of claim 16, wherein in (c), the second layer is removed by a fluorine-containing gas, and the first layer is removed by an oxidizing gas or a reducing gas after the second layer is removed.

18. The method of claim 1, further comprising: (c) after (b), removing the protective film.

19. The method of claim 1, wherein the protective film has water repellency.

20. The method of claim 1, wherein, in (a), the protective film is composed of a plurality of layers.

21. The method of claim 1, wherein the substrate processing apparatus further comprises a substrate supporter provided in the interior of the chamber, and
wherein, in the forming the protective film, the protective film is formed on a substrate support surface of the substrate supporter.

22. The method of claim 1, wherein (a) includes forming a first layer on the surface of the member, and forming a second layer on the first layer by the first processing gas.

* * * * *